(12) United States Patent
Okada et al.

(10) Patent No.: US 7,142,366 B2
(45) Date of Patent: Nov. 28, 2006

(54) METHOD OF MANUFACTURING MICROLENS SUBSTRATE, AND MICROLENS EXPOSURE OPTICAL SYSTEM

(75) Inventors: Kuniaki Okada, Tenri (JP); Minoru Ueda, Tenri (JP)

(73) Assignee: Sharp Kabushiki Kaisha (JP)

(*) Notice: Subject to any disclaimer, the term of this patent is extended or adjusted under 35 U.S.C. 154(b) by 586 days.

(21) Appl. No.: 10/718,335

(22) Filed: Nov. 19, 2003

(65) Prior Publication Data

US 2004/0099633 A1   May 27, 2004

(30) Foreign Application Priority Data

Nov. 19, 2002   (JP)   ............... 2002-335363

(51) Int. Cl.
*G02F 1/1335*   (2006.01)
(52) U.S. Cl. .................... 359/619; 355/67; 355/71
(58) Field of Classification Search .................. None
See application file for complete search history.

(56) References Cited

U.S. PATENT DOCUMENTS 5,164,223 A * 11/1992 Tsujino et al. .............. 427/520
5,666,176 A * 9/1997 Kurematsu .................. 349/95
2004/0051977 A1* 3/2004 Kitamura et al. ........... 359/754

FOREIGN PATENT DOCUMENTS

| JP | 07-181487 | 7/1995 |
|---|---|---|
| JP | 09-090336 | 4/1997 |

* cited by examiner

*Primary Examiner*—John A. McPherson
(74) *Attorney, Agent, or Firm*—David G. Conlin; William J. Daley, Jr.; Edwards Angell Palmer & Dodge LLP

(57) ABSTRACT

Provided is a method of manufacturing a microlens substrate capable of facilitating optical axis alignment and simplifying manufacturing processes by patterning a lens shape of a second microlens array using a first microlens array. The lens shape of the cylindrical second microlens array is patterned by irradiating the first microlens array with ultraviolet rays. Light emitted from a linear light source which is variable in its position is imaged on a focal surface of the first microlens array by a collimator lens and the first microlens array, and a resist layer formed by being coated on the focal surface is exposed. By performing exposure while changing the position of the linear light source, a resist pattern of a desired cylindrical shape can be obtained. Thereafter, etching is performed to transfer the shape of the resist pattern onto an intermediate glass layer, and recesses are buried with a high refractive index UV curable resin.

4 Claims, 11 Drawing Sheets

METHOD OF MANUFACTURING MICROLENS SUBSTRATE, AND MICROLENS EXPOSURE OPTICAL SYSTEM

CROSS-REFERENCE TO RELATED APPLICATION

This application is related to Japanese application No. 2002-335363 filed on Nov. 19, 2002, whose priority is claimed under 35 USC § 119, the disclosure of which is incorporated by reference in its entirety.

BACKGROUND OF THE INVENTION

1. Field of the Invention

The present invention relates to a method of manufacturing a microlens substrate, and a microlens exposure optical system. More specifically, the present invention relates to a method of manufacturing a microlens substrate for a projection-type liquid crystal display device that includes microlens arrays of a two-layer structure, and a microlens exposure optical system employed for this manufacturing method.

2. Description of the Related Art

A projection-type liquid crystal display device has excellent features, as compared with a projection-type CRT display device, of a wide color reproduction range, a small size and light weight and, therefore, handiness, no need of convergence adjustment because the device is not influenced by geomagnetism, and the like. In addition, since a screen of the device can be made larger easily, it is expected that the projection-type liquid crystal display device will be a leading home video display device.

As the projection-type liquid crystal display devices, those disclosed in Japanese Unexamined Patent Publication Nos. HEI 7 (1995)-181487 and HEI 9 (1997)-90336 to be described later in detail are known.

Examples of the projection-type liquid crystal display devices that display a color image using a liquid crystal display element include: a three-board liquid crystal display device using three liquid crystal display elements according to three primary colors of light; and a single-board liquid crystal display device using only one liquid crystal display element.

The three-board liquid crystal display device includes an optical system that divides white light into three primary colors of R, G and B, and the three liquid crystal display elements that control and combine respective color lights to form a color image, independently of each other. This liquid crystal display device optically superimposes the images of the respective colors and, thereby, provides full-color display.

With the configuration of this three-board liquid crystal display device, it is advantageously possible to effectively utilize light radiated from a white light source and ensure high color purity. However, this device has the following disadvantages. As described above, since the device requires a color separating system and a color combining system, the configuration of an optical system is complicated, the number of components increases, and it is difficult to realize cost reduction and size reduction.

On the other hand, the single-board liquid crystal display device is constituted to employ only one liquid crystal display element and to project the liquid crystal display element that includes filter patterns of three primary colors such as mosaic or stripe patterns. Since the number of liquid crystal display elements employed in the device is only one and the configuration of an optical system is simpler than that in the three-board liquid crystal display device, the single-board liquid crystal display device is appropriate for a low-cost, small-sized projection-type system.

However, the single-board liquid crystal display device has the following disadvantage. Since the color filters absorb or reflect colors, this device can use only about a third of incident light.

In order to solve these disadvantages, Japanese Unexamined Patent Publication No. HEI 7 (1995)-181487 discloses a color filter-less single-board liquid crystal display device that employs microlens arrays of a two-layer structure as shown in FIG. 11.

In this device, each of three dichroic mirrors 54G, 54R and 54B arranged in fan-shape divides white light emitted from a white light source 51 to respective colors of G, R and B, and makes the divided colors incident on two microlens arrays 4 and 7, arranged on a light source side of a liquid crystal display element 20, at different angles.

The light emitted from the white light source 51 is guided to the liquid crystal display element 20 via a curved mirror 52, a collimator lens 53, and the dichroic mirrors 54G, 54R and 54B.

Respective light fluxes that have passed through the first microlens array 4 are refracted by the second microlens array 7 so that main light beams of G, R and B divided by the dichroic mirrors 54G, 54R and 54B are almost in parallel to one another, and emitted to a liquid crystal region driven by a signal electrode to which corresponding color signals are applied independently, in a distributed manner.

The lights that have passed through the liquid crystal display element 20 are projected onto a screen 57 via a field lens 55 and a projection lens 56.

Since this device employs no absorption color filter, not only light utilization efficiency is improved but also the main light beams of the respective colors passing through the microlens arrays 4 and 7 are made almost in parallel. Accordingly, the spread of the main light beams of the respective colors until they reach the projection lens 56 is small, there is no a reduction in quantity of light caused by eclipse at the projection lens 56, and the device can provide an extremely bright image.

FIG. 12A is a plan view that illustrates an arrangement relationship among pixels, the first microlens 4, and the second microlens 7 in the simple-board liquid crystal display device shown in FIG. 11. FIG. 12B is a perspective view that illustrates a shape of a lens surface of the second microlens 7.

As shown in FIGS. 12A and 12B, the pixels are arranged at a constant pitch so as to correspond to a B component, an R component and a G component, respectively. The first microlens 4 and the second microlens 7 each correspond to a set of three pixels respectively corresponding to the B component, R component and G component.

The first microlens 4 is a spherical or aspheric axisymmetric lens having a hexagonal outline as indicated by a broken line in FIG. 12A. The second microlens 7 is a cylindrical lens having a rectangular outline as indicated by a solid line in FIG. 12A and having a convergence function in an X-axis direction. A black matrix 8, which is patterned as indicated by hatching, separates the respective color components of R, G and B.

Optical axes of the respective lenses that constitute the first microlens 4 and those of the respective lenses that constitute the second microlens 7 are in parallel to one another. The light axes of the opposite lenses of the first microlens 4 and the second microlens 7 are set coincident with each other.

The first microlens 4 converges incident light fluxes of three primary colors (R component, G component and B component), separated from one another with predetermined angle differences in advance, onto each set of corresponding three pixels. The second microlens 7 interposes between the corresponding first microlens 4 and the corresponding set of three pixels, and converts incident light fluxes inclined relative to the optical axis of the second microlens into incident light fluxes substantially parallel to the optical axis thereof.

Since the second microlens 7 is a cylindrical lens as shown in FIG. 12B, the second microlens 7 allows the first incident light flux (R component) that is originally parallel to the optical axis to move straight, collimates the second incident light flux (B component) inclined toward one side, and collimates the third incident light flux (G component) inclined toward the other side.

Microlens arrays having such a two-layer structure are formed by coupling them to both sides of one glass substrate, respectively. Alternatively, as disclosed in Japanese Unexamined Patent Publication No. HEI 9 (1997)-90336, the microlens arrays are formed by separately manufacturing the first microlens array and the second microlens array and coupling a lens formation surface of the first microlens array to a polished surface of the second microlens array.

However, the conventional microlens substrate having the two layers of microlens arrays is manufactured by coupling the respective microlens arrays to both sides of one glass substrate or by aligning two microlens substrates to each other as described above. The conventional microlens substrate has disadvantages in that it is difficult to make optical axes aligned to each other and production cost is thereby raised for the following reasons.

In the case of the microlens substrate having two layers of microlens arrays, it is necessary to execute a step of making optical axes of the two microlens arrays aligned to each other. In order to ensure optical characteristics of the lenses, it is required to make all of longitudinal directions, lateral directions and angles (rotating directions) of the two lens arrays aligned to one another. Nevertheless, because of fine lens patterns, an accuracy of about ±1 µm is required for the optical axis alignment, which makes it quite difficult to manufacture the microlens substrate of the two-layer structure.

The interposition of an intermediate layer between the two layers of microlens arrays also makes the optical axis alignment difficult. Namely, because of a gap between the two layers of lens patterns, it is impossible to observe both of positioning alignment marks of the two layers in focus simultaneously. It is possible to provide an individual alignment mark observation system for each layer and perform the optical axis alignment. In that case, however, it is also required to strictly make the optical axes of the alignment mark observation systems aligned to each other, which disadvantageously raises the cost of a positioning device.

SUMMARY OF THE INVENTION

The present invention has been achieved to solve the conventional disadvantages. It is an object of the present invention to provide a method of manufacturing a microlens substrate, capable of facilitating optical axis alignment and simplifying manufacturing processes by patterning a lens shape of a second microlens array using a first microlens array, and a microlens exposure optical system.

According to one aspect of the present invention, there is provided a method of manufacturing a microlens substrate, including the steps of: forming a laminar first microlens array on a transparent substrate; forming an intermediate layer and a photosensitive resin layer in this order on the first microlens array; exposing the photosensitive resin layer via the first microlens array and the intermediate layer; developing the exposed photosensitive resin layer to form a pattern for forming a second microlens array; forming recesses for forming the second microlens array in the intermediate layer by performing etching until the pattern is removed; and forming the second microlens array by burying the recesses with a resin, wherein the exposure step involves: emitting lights having a uniform intensity from a light source; imaging the emitted lights on a focal surface of the first microlens array located on the photosensitive layer; and exposing the photosensitive resin layer by changing an exposure duration according to a focal position of the first microlens array.

In the microlens substrate manufacturing method according to the present invention, the lens shape of the second microlens array can be patterned using the first microlens array. Therefore, it is unnecessary to perform optical axis alignment between the two layers of the lens arrays and there occurs no shift between lens intervals of the respective layers. It is therefore possible to simplify manufacturing processes of the microlens substrate of the two-layer structure and reduce manufacturing cost.

DESCRIPTION OF THE PREFERRED EMBODIMENTS

Figure 1:
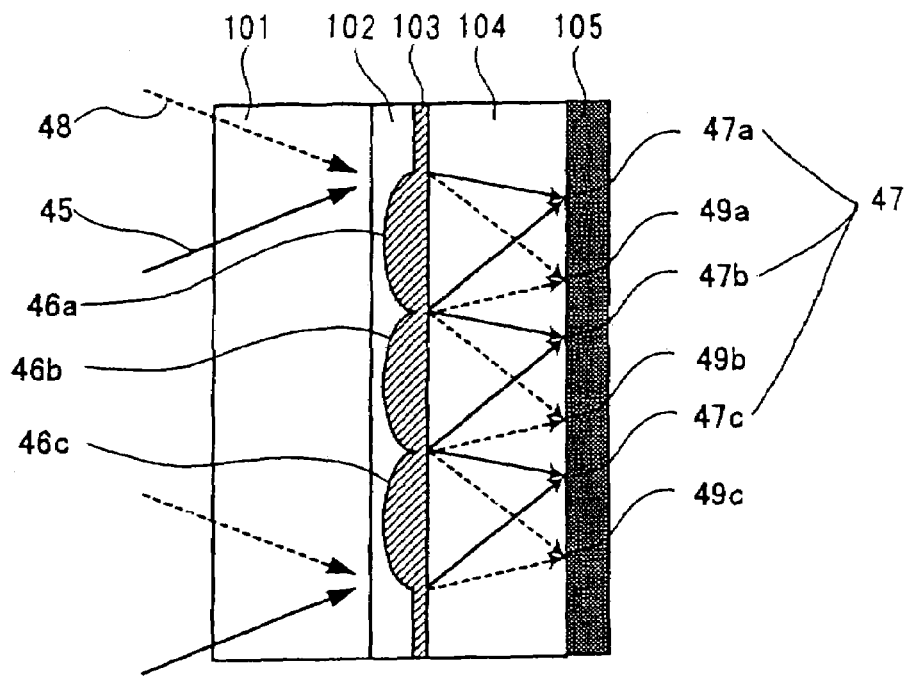
FIG. 1 is a cross-sectional view that describes the principle of a method of exposing a resist layer on a microlens substrate formed by using a manufacturing method according to the present invention.

As the light source that is employed for the microlens substrate manufacturing method according to the present invention and that emits lights having the uniform intensity, a linear light source or a rectangular surface light source having a variable size can be employed.

By using such a linear light source or rectangular light source having a variable size, it is possible to facilitate controlling an exposure amount on the photosensitive resin layer.

When the light source that emits the light having the uniform intensity is the linear light source, an image of the linear light source is formed on the photosensitive resin layer of the transparent substrate on which the first microlens array, the intermediate layer and the photosensitive resin layer are formed (a plate that becomes the microlens substrate) and the photosensitive resin layer is linearly exposed. It is preferable that the photosensitive resin layer is exposed while changing a position of the linear light source or by fixing a position of the linear light source, and rotatably arranging the plate that becomes the microlens substrate so as to be inclined relative to the lights emitted from the linear light source, and while rotating the plate. With this structure, it is possible to facilitate controlling the exposure amount on the photosensitive resin layer.

When the light source that emits the lights having the uniform intensity is the rectangular surface light source having a variable emission area, an image of the surface light source is formed on the photosensitive resin layer and the photosensitive resin layer is rectangularly exposed. It is preferable that the exposure of the photosensitive resin layer is performed while varying the emission area of the surface light source by changing an opening width of an aperture having a rectangular opening formed therein. With this structure, it is possible to facilitate controlling the exposure amount on the photosensitive resin layer.

According to another aspect of the present invention, there is provided a microlens exposure optical system used for manufacturing a microlens substrate having a first microlens array, an intermediate layer and a second microlens array laminated in this order on a transparent substrate, the microlens exposure optical system including: a linear light source emitting lights having a uniform intensity; a collimator lens collimating the lights emitted from the linear light source; and the transparent substrate having a photosensitive resin layer formed on the intermediate layer, the lights passed through the collimator lens being imaged on the photosensitive resin layer via the first microlens array and the intermediate layer.

In this microlens exposure optical system, the lens shape of the second microlens array can be patterned using the first microlens array. Therefore, it is unnecessary to perform optical axis alignment between the two layers of the lens arrays and there occurs no shift between lens intervals of the respective layers. It is therefore possible to simplify manufacturing processes of the microlens substrate of the two-layer structure and reduce manufacturing cost.

It is preferable that a position of the linear light source in the microlens exposure optical system according to the present invention is variable. Such a linear light source can facilitate varying the position of an image of the linear light source.

It is preferable that the plate (transparent substrate) in the microlens exposure optical system according to the present invention is arranged so that a tilt angle formed between its normal and an optical axis of the light is variable. Such a plate can facilitate varying the position of the image of the linear light source.

It is preferable that the microlens exposure optical system according to the present invention further includes a narrow band filter inserted into an optical path of the lights emitted from the linear light source. In the case where such a narrow band filter is provided, there is no possibility of getting the linear light image blurred by a chromatic aberration of each microlens, and the structure can be therefore formed with higher accuracy.

According to still another aspect of the present invention, there is provided a microlens exposure optical system used for manufacturing a microlens substrate having a first microlens array, an intermediate layer and a second microlens array laminated in this order on a transparent substrate, the microlens exposure optical system including: a rectangular surface light source emitting lights having a uniform intensity, and having a variable emission area; a collimator lens collimating the lights emitted from the surface light source; and the transparent substrate having a photosensitive resin layer formed on the intermediate layer, the lights passed through the collimator lens being imaged on the photosensitive resin layer via the first microlens array and the intermediate layer.

In this microlens exposure optical system, the lens shape of the second microlens array can be patterned using the first microlens array. Therefore, it is unnecessary to perform optical axis alignment between the two layers of the lens arrays and there occurs no shift between lens intervals of the respective layers. It is therefore possible to simplify manufacturing processes of the microlens substrate of the two-layer structure and reduce manufacturing cost.

It is preferable that the microlens exposure optical system according to the present invention further includes a narrow band filter inserted into an optical path of the lights emitted from the surface light source. In the case where such a narrow band filter is provided, there is no possibility of getting the image of the surface light blurred by a chromatic aberration of each microlens and the structure can be therefore formed with higher accuracy.

Hereinafter, embodiments of the present invention will be described in detail with reference to the accompanying drawings. It should be noted that the present invention is not limited to these embodiments.

The principle of a method of exposing a resist layer that serves as a photosensitive resin layer for forming a lens pattern of a second microlens array will be described with reference to FIG. 1.

In a projection-type liquid crystal display device according to the present invention, a first microlens array 102 is designed so that a focus of a lens is almost on a surface of a black matrix for the purpose of improving the light utilization efficiency of the display device. The first microlens array 102 and the second microlens array 47 are arranged to be as far from each other as possible. The second microlens array 47 is formed in the vicinity of the black matrix.

In a manufacturing process, an upper surface of an intermediate glass layer 104 is located to be almost coincident with a focal surface of the first microlens array 102 in an intermediate glass layer alignment step. The resist layer 105 that serves as a photosensitive resin layer is formed by coating the resist layer 105 onto an upper surface of the intermediate glass layer 104. When ultraviolet parallel lights are applied to the display device through the first microlens array 102, the parallel lights are converged on one point on the resist layer 105 by the first microlens array 102, and the resist layer 105 is exposed by a resultant converged spot.

When it is assumed herein that an incident angle at which an ultraviolet parallel light is incident on a transparent substrate 101 is θi, a focal length of the first microlens array 102 is f, and a distance from a position, at which an optical axis of a lens crosses a focal surface, to the converged spot is r, the distance r is expressed by the following equation:

$$r = f \times \tan \theta i$$

Accordingly, by changing the incident angle θi of the ultraviolet parallel light, a position of the converged spot can be changed.

For example, in FIG. 1, when an ultraviolet parallel light flux 45 having the incident angle θi is incident on the transparent substrate 101, the light flux 45 is converged on points 47a, 47b and 47c by three microlenses 46a, 46b and 46c, respectively, and the resist layer 105 is exposed at these points.

Then, when the incident angle θi is changed to θj and a parallel light flux 48 is incident at the incident angle θj on the transparent substrate 101, the light flux 48 is converged on points 49a, 49b and 49c by the three microlenses 46a, 46b and 46c, respectively, and the resist layer 105 is exposed at these points.

In the case where a negative resist is used as a material for the resist layer 105, the resist layer 105 remains thick at the points at which the resist layer 105 is strongly exposed and the resist layer 105 is thinned at the points at which the resist layer 105 is weakly exposed. Therefore, by controlling the incident angles θi (θj) and exposure durations (or intensities of irradiated lights) of the ultraviolet parallel light fluxes, exposure can be performed with a desired exposure amount at desired points. By repeating the exposure step, the resist layer 105 can be exposed to have a desired pattern.

When ultraviolet parallel lights capable of irradiating the entire first microlens array 102 at a uniform light intensity are employed as exposure lights, the above-described exposure is performed on the first microlens array 102 right under the lenses 46a, 46b and 46c within an irradiation range of the parallel lights. Therefore, the second microlens array having a uniform shape can be formed.

Figure 2:
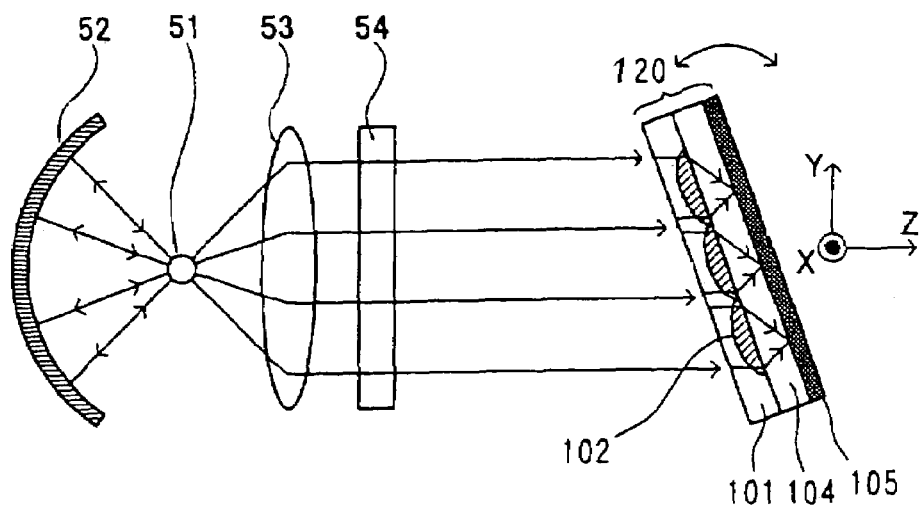
FIG. 2 is a cross-sectional view that illustrates the configuration of an exposure optical system employed to manufacture the microlens substrate shown in FIG. 1.

An exposure optical system used for performing this exposure step will next be described with reference to FIG. 2. FIG. 2 illustrates the configuration of the exposure optical system.

In FIG. 2, a reference numeral 51 denotes a super high pressure mercury discharge lamp which is a light source of exposure light. An i-ray (wavelength: 365 nm) of the ultraviolet light emitted from the super high pressure mercury discharge lamp 51 is collimated to a parallel light by a spherical mirror 52 and a collimator lens 53, and guided to a plate 120 that becomes a microlens substrate via an intensity correction filter 54.

The intensity correction filter 54 has a transmittivity distribution, and the transmittivity distribution is designed so that transmitted light fluxes have a uniform light intensity distribution. Therefore, the ultraviolet parallel lights having the uniform light intensity distribution are irradiated onto the plate 120 that becomes the microlens substrate.

The plate 120 that becomes the microlens substrate is mounted on a biaxial rotation rotational stage (not shown). By controlling a rotational angle of this rotational stage, a tilt angle (gradient) formed by a normal of the plate 120 that becomes the microlens substrate and a light axis of the ultraviolet parallel light can be freely changed.

In this embodiment, the light axis of the ultraviolet parallel light is fixed and the plate 120 that becomes the microlens substrate is rotated about an X axis and a Y axis, whereby the incident angle of each ultraviolet parallel light relative to the first microlens array 102 is changed. By performing exposure while controlling the incident angles as well as the exposure duration for each incident angle, it is possible to form a desired three-dimensional pattern on the resist layer 105.

In this embodiment, the focal position is changed by changing each incident angle. However, the method of changing the focal position is not limited to this method but may be an arbitrary method.

Further, in this embodiment, the desired three-dimensional pattern is obtained by controlling the exposure duration according to the focal position. There is also a method of controlling the exposure intensity without controlling the exposure duration.

However, when such a light source as the super high pressure mercury discharge lamp is employed, light intensity cannot be controlled and an external light modulator is required. Even when the light modulator is employed, it is difficult to accurately control the exposure intensity over the entire exposure area, with the result that the desired three-dimensional pattern cannot be obtained. That is, control over the exposure duration rather than control over the exposure intensity so as to obtain the desired three-dimensional pattern provides better shape characteristics, facilitates control, and simplifies the configuration of the device.

Hereinafter, the embodiments of the present invention will be described.

Figure 3:
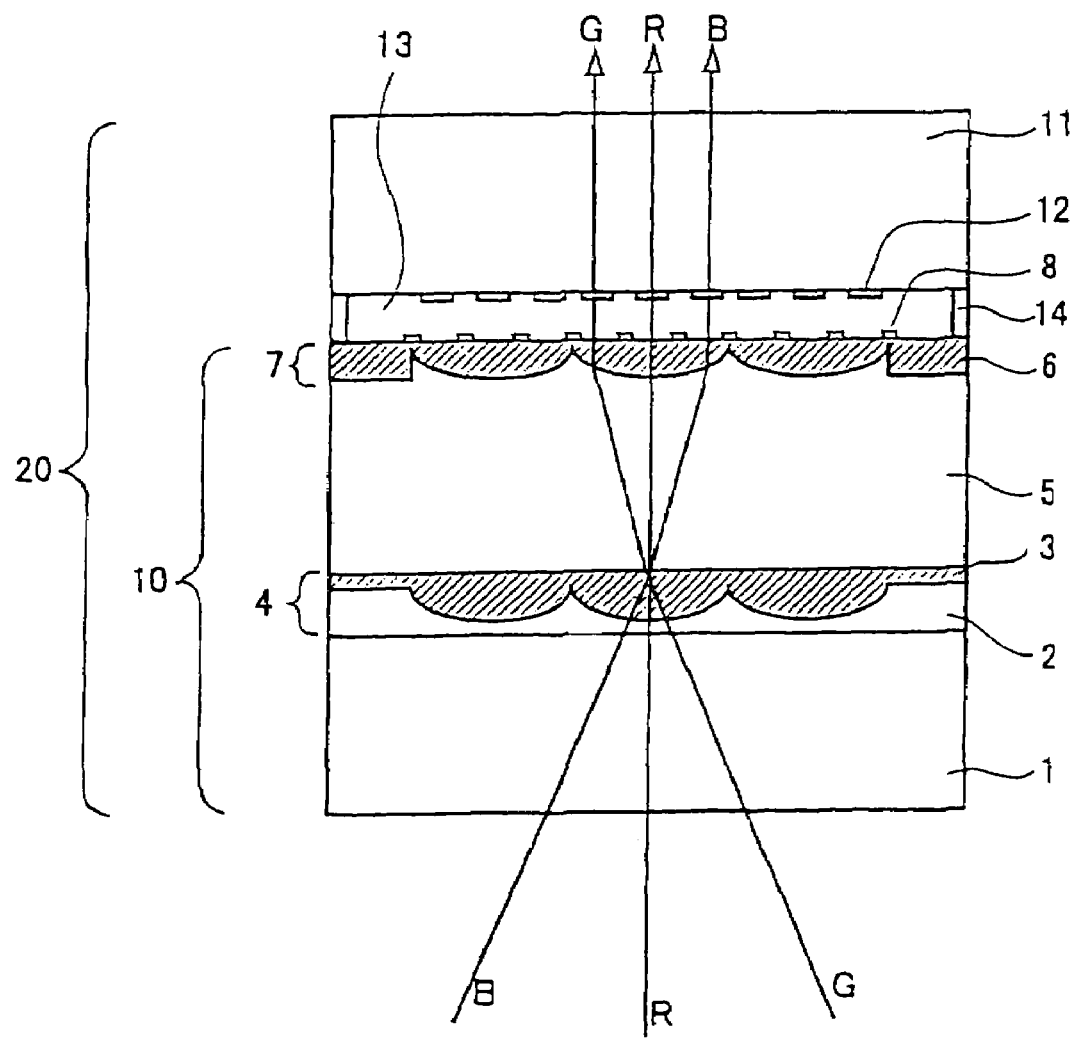
FIG. 3 is a cross-sectional view that illustrates configurations of the microlens substrate and a liquid crystal display element formed by using the manufacturing method according to the present invention.

FIG. 3 is a cross-sectional view that illustrates the configuration of the microlens substrate and a liquid crystal display element formed by using the manufacturing method according to the present invention.

The liquid crystal display element 20 includes a microlens substrate 10 and a glass substrate 11, with a liquid crystal layer 13 sealed between the microlens substrate 10 and the glass substrate 11. On an inner surface of the glass substrate 11 located on a light emission side, a signal electrode 12 that changes a phase of the liquid crystal layer 13 is formed. On an inner surface of the microlens substrate 10 located on a light incidence side, a scan electrode (not shown) orthogonal to the signal electrode 12 is provided. Each of the signal electrode 12 and the scan electrode is formed from a transparent electrode (indium tin oxide) (ITO).

The microlens substrate 10 is constituted so that two microlens arrays 4 and 7 are formed on a transparent substrate 1. An interface between two transparent resin 21. layers 2 and 3 having different refractive indexes is formed into a lens pattern and the first microlens array 4 is formed by this interface. As the resin layer 3, a layer having a higher refractive index than that of the resin layer 2 is selected.

The second microlens array 7 is formed on the resin layer 3. Namely, an interface between the intermediate glass layer 5 and the transparent resin layer 6 different in refractive index is formed into a lens pattern, and the second microlens array 7 is formed by this interface. As the resin layer 6, a layer having a higher refractive index than that of the intermediate glass layer 5 is selected. The black matrix 8 that separates pixels of respective color components is formed on the resin layer 6.

By aligning the microlens substrate 10 and the glass substrate 11 to each other through a spacer layer 14 and sealing the liquid crystal layer 13 therebetween, the liquid crystal display element 20 is completed.

According to the present invention, the lens shape of the second microlens array 7 is patterned using the first microlens array 4, whereby the microlens substrates 10 of a two-layer structure is formed.

A method of manufacturing this microlens substrate 10 will be described with reference to FIGS. 4A to 4F. FIGS. 4A to 4F are cross-sectional views that illustrate respective manufacturing steps of manufacturing the microlens substrate 10.

The first microlens array 4 is formed by a so-called 2P (Photo-Polymerization) method that employs a UV curable resin cured by irradiation with ultraviolet rays.

Figure 4:
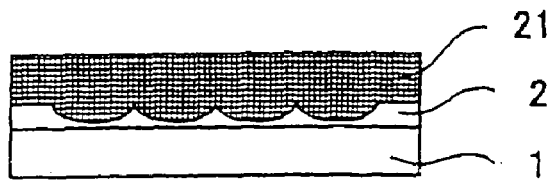
FIGS. 4A to 4F are cross-sectional views that illustrate respective steps of the method of manufacturing the microlens substrate according to the present invention.
Figure 4:
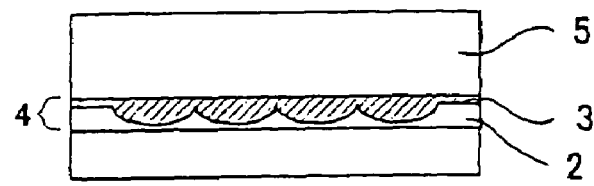
Figure 4:
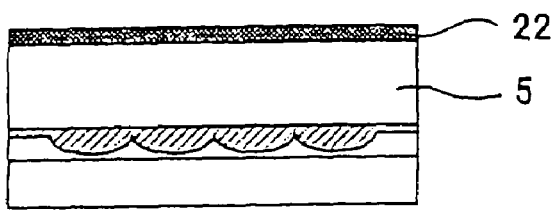
Figure 4:
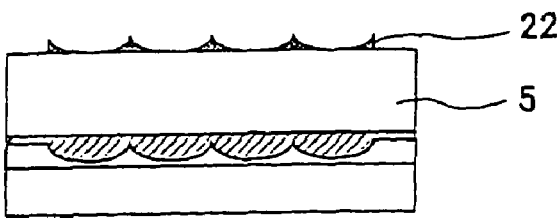
Figure 4:
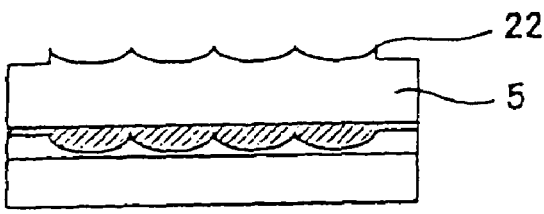
Figure 4:
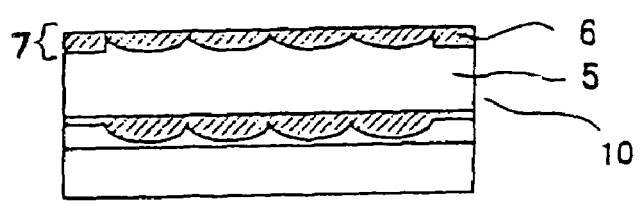

First, as shown in FIG. 4A, a low refractive index UV curable resin 2 is coated onto a quartz transparent substrate 1 and a stamper 21 is made descend onto the resin 2. A reverse pattern corresponding to a first microlens pattern is formed on a lower surface of the stamper 21.

This stamper 21 is sufficiently pressed against the quartz transparent substrate 1 to widen the UV curable resin 2 between the stamper 21 and the quartz transparent substrate 1. While maintaining this state, ultraviolet rays are irradiated onto the UV curable resin 2 through the quartz transparent substrate 1 by an ultraviolet lamp or the like.

The UV curable resin 2 irradiated with the ultraviolet rays is cured as a result of a curing reaction, so that the reverse pattern of the stamper 21 is transferred onto the UV curable resin 2. After the UV curable resin 2 is cured, the stamper 21 is raised to thereby separate the UV curable resin 2 from the stamper 21.

As shown in FIG. 4B, a high refractive index UV curable resin 3 is coated onto the cured low refractive index UV curable resin 2 to bury recesses of the low refractive index UV curable resin 2. A quartz thin plate glass (intermediate glass layer) 5 that serves as an intermediate layer between the first microlens array 4 and the second microlens array 7 is bonded onto the high refractive index UV curable resin 3.

The intermediate glass layer 5 is sufficiently pressed against the quartz transparent substrate 1, and ultraviolet rays are irradiated through the intermediate glass layer 5 to thereby cure the high refractive index UV curable resin 3. This resin 3 also serves as an adhesive bonding layer for the intermediate glass layer 5. Thereafter, if a thickness of the intermediate glass layer 5 is larger than a desired thickness, the intermediate glass layer 5 is polished to the desired thickness by grinding.

As shown in FIG. 4C, a negative resist layer 22 serving as a photosensitive resin layer is formed by coating the layer 22 onto the intermediate g lass layer 5. Ultraviolet rays are irradiated onto this negative resist layer 22 through the first microlens array 4 to expose the negative resist layer 22.

The microlens substrate 10 is designed so that a focal position of the first microlens array 4 is inside the resist layer 22.

Since the resist layer 22 is a negative resist, the resist layer 22 remains thick at the points at which the resist layer 22 is strongly exposed and remains thin at the points at which the resist layer 22 is weakly exposed. Accordingly, by controlling an exposure amount at each point, it is possible to control a residual film quantity after development and form a three-dimensional structure using the resist. This exposure step will be described later in detail.

When a development step is executed after this exposure step, a lens pattern of the second microlens array 7 is formed on the resist layer 22 as shown in FIG. 4D. A post-bake treatment is carried out after the development step.

As shown in FIG. 4E, dry etching is performed to transfer the shape of the lens pattern formed on the resist layer 22 to the intermediate glass layer 5. As a dry etching method, reactive ion etching, ion milling or the like can be performed.

At this time, depending on the selection of an etching condition, the thickness of the lens pattern on the resist layer 22 can be increased. When an etching condition under which an etching selectivity of the resist to the quartz glass is, for example, 1:2 is selected, the lens pattern having a thickness of 10 μm on the resist layer 22 is increased to the lens pattern having a thickness of 20 μm on the intermediate glass layer 5. Thus, the shape of the lens pattern formed on the resist layer 22 is determined also in view of this etching selectivity.

As shown in FIG. 4F, a high refractive index UV curable resin 6 is coated onto the intermediate glass layer 5 to bury recesses of the intermediate glass layer 5. Thereafter, ultraviolet rays are irradiated to cure the high refractive index UV curable resin 6.

At this time, an upper surface of the high refractive index UV curable resin 6 is planarized. For the planarization, the following two methods are known.

In the first planarization method, a quartz flat plate that has been subjected to a release treatment in advance is pressed against an upper surface of the high refractive index UV curable resin 6 while the resin 6 is uncured, ultraviolet rays are irradiated, and the high refractive index UV curable resin 6 is thereby cured. By releasing the quartz flat plate after curing the resin 6, the high refractive index UV curable resin layer 6 having a smooth upper surface is obtained. In the second method, a polishing treatment is performed after curing the high refractive index UV curable resin 6, and the surface of the high refractive index UV curable resin 6 is thereby planarized.

Through the above-described steps, the microlens substrate 10 having the second microlens array 7 formed on the upper surface of the first microlens array 4 is completed.

Next, embodiments of an exposure optical system used for exposing the resist layer 22 to form the lens pattern of the second microlens array 7 will be described.

First Embodiment

Figure 5:
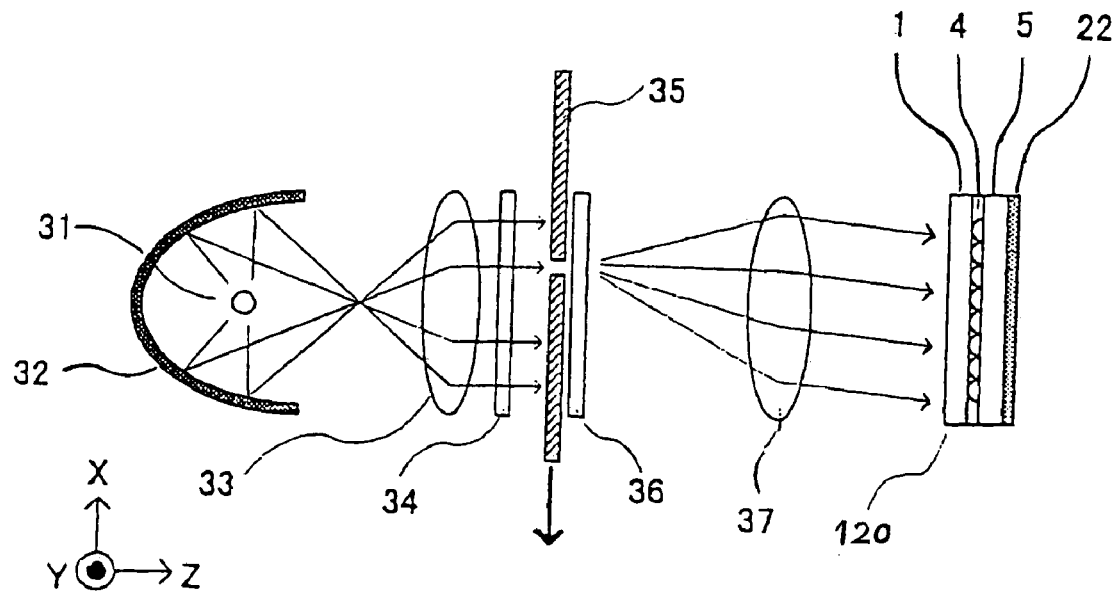
FIGS. 5A and 5B illustrate a first embodiment of the method of manufacturing the microlens substrate according to the present invention.
Figure 5:
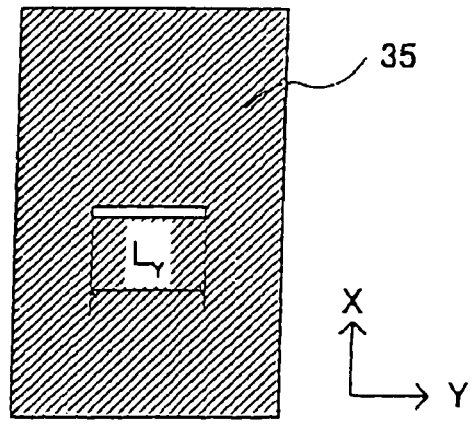

FIG. 5A illustrates a first embodiment of the configuration of an exposure optical system according to the present invention. In FIG. 5A, a reference numeral 31 denotes a super high pressure mercury discharge lamp that serves as a light source of exposure light. Such ultraviolet rays as an i-ray (wavelength: 365 nm), an h-ray (wavelength: 405 nm) and a g-ray (wavelength: 436 nm) are emitted from the super high pressure mercury discharge lamp 31.

These ultraviolet rays are reflected and converged by a curved mirror 32, collimated to parallel lights by a first collimator lens 33, and passed through an i-ray pass-filter 34 that serves as a narrow band-pass optical filter and a movable slit plate 35 serving as an aperture.

As shown in FIG. 5B, the movable slit plate 35 is designed so that an opening length (slit length) in an Y-axis direction has a fixed length $L_Y$ and an opening width (slit width) in an X-axis direction is narrower. The movable slit plate 35 is movable along the X axis.

The lights that have been passed through the movable slit plate 35 are guided to and scattered by a scattering plate 36. The scattering plate 36 functions to scatter the lights transmitted by the movable slit plate 35 in all directions. A linear light source having the length $L_Y$ in a Y direction is formed by the movable slit plate 35 and the scattering plate 36.

Thereafter, the lights of the linear light source having the length $L_Y$ are guided to a second collimator lens 37. The second collimator lens 37 is arranged so that a distance between the scattering plate 36 and the second collimator lens 37 is coincident with a focal length of the second collimator lens 37. The lights that have been passed through the second collimator lens 37 are guided to the plate 120 that becomes the microlens substrate on which the negative resist layer 22 serving as a photosensitive resin layer is formed by coating.

The linear light source formed by the movable slit plate 35 and the scattering plate 36 is imaged by the second collimator lens 37 and the respective lenses of the first microlens array 4 to have an image at a size of a magnification M on a focal surface of the first microlens array 4 to thereby expose the negative resist layer 22. That is, a linear light image is formed on a focal surface of each lens on the first microlens array 4 and the resist layer 22 is linearly exposed.

Using the slit length $L_Y$, a length $L_R$ of this linear exposure area is defined as follows:

$$L_R = L_Y M$$

$$M = f_c / f_M$$

wherein $f_c$ is a focal length of the second collimator lens 37, $f_M$ is a focal length of the first microlens 4, and M is a magnification of the optical system.

When the movable slit plate 35 is moved along the X axis, the position of the linear light source constituted by the movable slit plate 35 and the scattering plate 36 varies along the X axis. A position of a linear light formed on the focal surface of each microlens varies accordingly.

When exposure is performed while controlling the position of the movable slit plate 35 and exposure durations (or intensities of irradiated lights), the exposure amount can be controlled at each position and a three-dimensional structure can be, therefore, formed.

Figure 6:
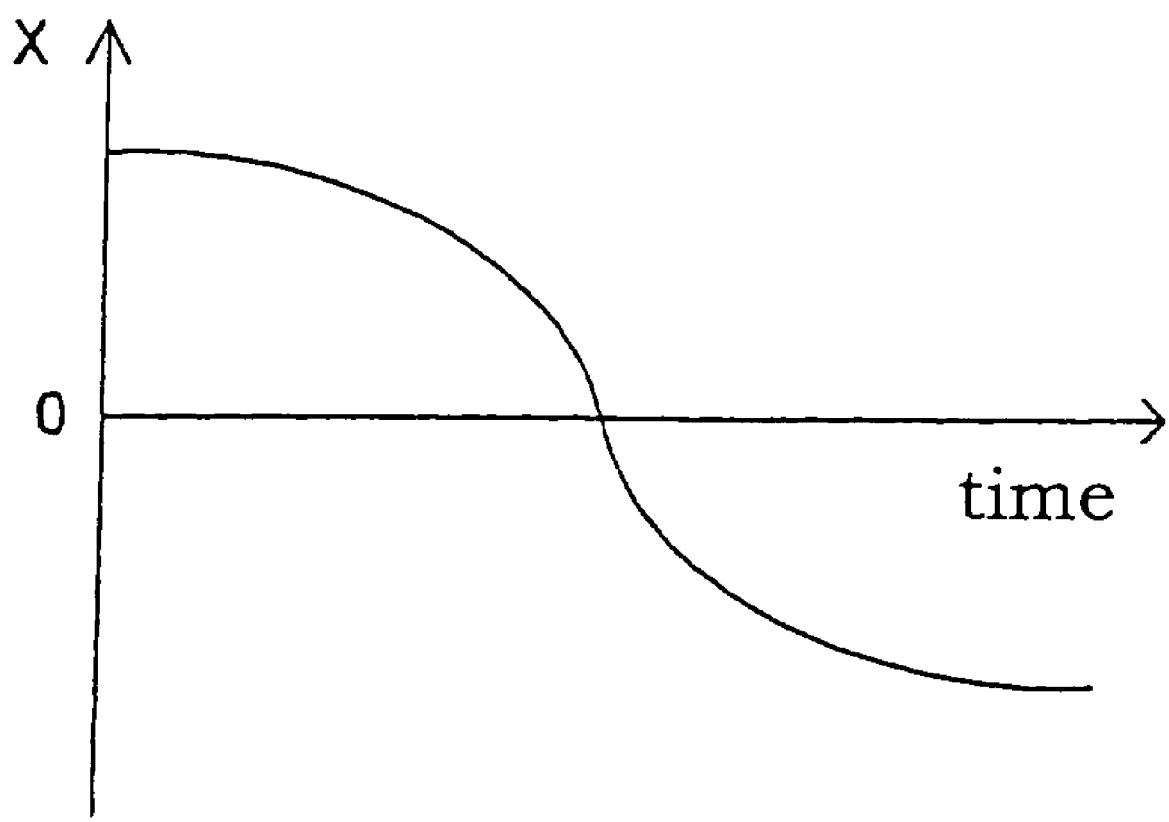
FIG. 6 illustrates control conditions for the first embodiment.
Figure 12:
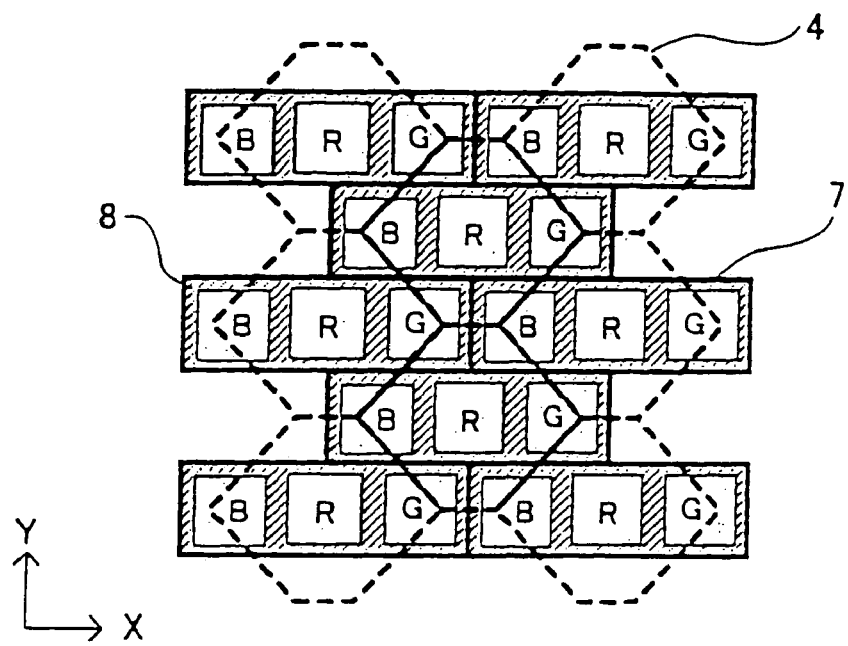
FIGS. 12A and 12B illustrate the arrangement and shape of microlens arrays that constitute the microlens substrate shown in FIG. 11, respectively.
Figure 12:
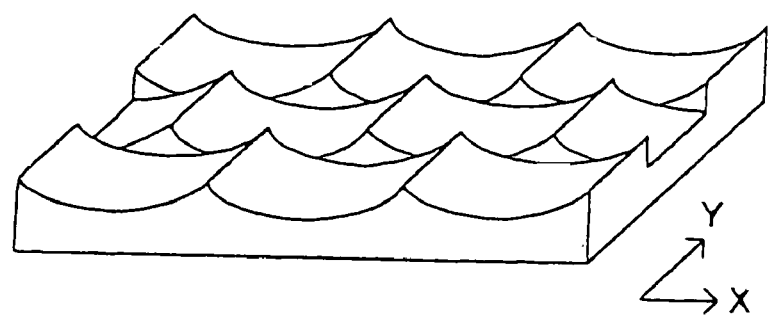

When the position X of the movable slit plate 35 is controlled, for example, as shown in FIG. 6, a cylindrical resist pattern as shown in FIG. 12B can be formed.

An i-ray pass-filter 34 formed halfway along this exposure optical system is used to cut a g-ray and an h-ray. In the case where the resist has a wide photosensitive band and is photosensitive to both of the g-ray (wavelength) and the h-ray (wavelength), the i-ray pass-filter 34 is inserted into parallel light fluxes to extract only the i-ray. With this structure, there is no possibility of getting the linear light image blurred by a chromatic aberration of each microlens and the structure can be, therefore, formed with higher accuracy.

For this exposure optical system, the light intensity uniformity of the linear light source constituted by the movable slit plate 35 and the scattering plate 36 is important. In order to improve the light intensity uniformity for the parallel lights emitted from the first collimator lens 33, an integrator or the like that improves the light intensity uniformity may be inserted between the curved mirror 32 and the first collimator lens 33.

In this exposure optical system, it is necessary that respective points on the linear light source have a uniform radiation characteristic. When a fly's eye lens is provided in place of the scattering plate 36, each linear light is divided to a plurality of point light sources by the fly's eye lens. By employing a fly's eye lens having a uniform shape, radiation characteristics of the respective point light sources can be made uniform and irregularities in the shape of the resist pattern on the entire exposure surface can be suppressed to be small.

In the method of manufacturing the microlens substrate according to the present invention, the second microlens array 7 is patterned through the first microlens array 4. Therefore, it is possible to greatly suppress misalignment between lenses on the first microlens array 4 and those on the second microlens array 7.

The optical axis misalignment between lenses on the first microlens array 4 and those on the second microlens array 7 is derived from the tilt angle (optical axis gradient) formed between the normal of the surface of the microlens array substrate 10 and the optical axis of each exposure light. In the case where the focal length of the first microlens array 4 is 100 μm, the optical axis misalignment between the lenses can be suppressed to be equal to or less than 0.9 μm at the optical axis gradient within 0.5°.

The optical axis gradient of equal to or less than 0.5° is a value that can be easily realized. Therefore, the method of manufacturing the microlens substrate according to the present invention can suppress the optical axis misalignment between the lenses to be small.

In the method of individually manufacturing the first microlens array 4 and the second microlens array 7, a lens interval in a plane of the first microlens array 4 is shifted from that in a plane of the second microlens array 7 in some cases according to a variation in manufacturing conditions for manufacturing the respective microlens arrays 4 and 7. In the manufacturing method according to the present invention, by contrast, the second microlens array 7 is manufactured based on the first microlens array 4. Therefore, the manufacturing method of the present invention is advantageous in that the difference in lens interval between the respective layers of microlens arrays does not occur.

In the method of manufacturing the microlens substrate 10 described above, in the case where the focal distance of the first microlens array 4 is shifted from a design value due to a variation in manufacturing conditions, the shape of the second microlens array 7 changes, accordingly. In this case, by controlling a displacement rate of the movable slit plate 35 in accordance with a focal length shifted quantity, the second microlens array 7 can be formed to have a desired shape.

Second Embodiment

Figure 7:
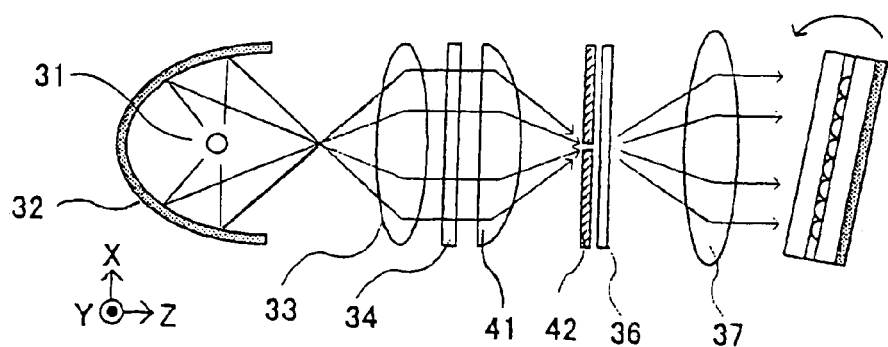
FIGS. 7A to 7C illustrate a second embodiment of the method of manufacturing the microlens substrate according to the present invention.
Figure 7:
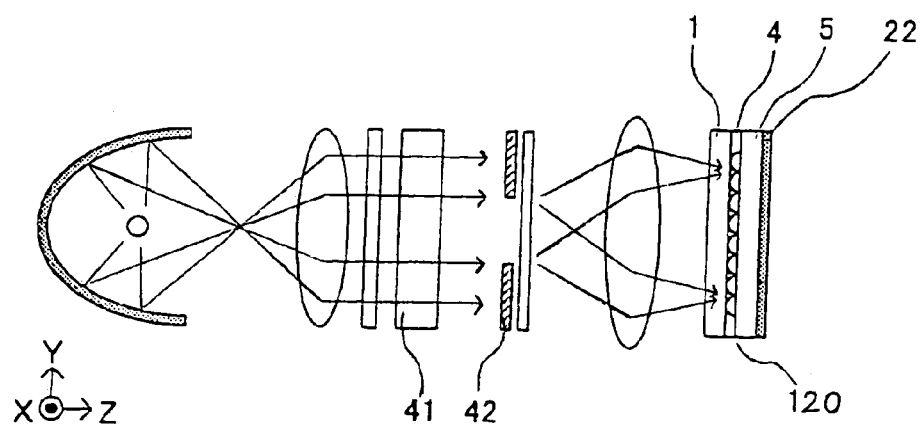
Figure 7:
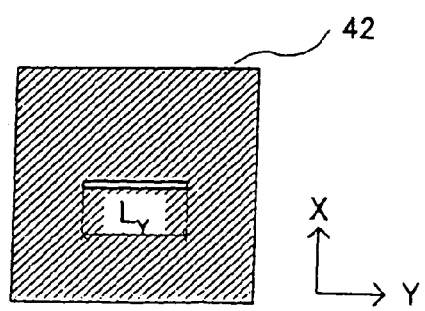

FIGS. 7A to 7C illustrate a second embodiment of the configuration of an exposure optical system according to the present invention. In the second embodiment, the configuration from the light source 31 to the first collimator lens 33 is the same as that in the first embodiment.

As a result of converging parallel light fluxes emitted from the first collimator lens 33 in the X direction by a cylindrical lens 41, a linear light source is formed. This linear light source is limited to have a certain length by a slit plate 42 having the length of $L_Y$ and scattered by the scattering plate 36. That is, on a surface of the scattering plate 36, the linear light source having the length $L_Y$ is formed.

Thereafter, similarly to the first embodiment, the second collimator lens 37 and the plate 120 that becomes the microlens substrate are arranged. The second embodiment, however, differs from the first embodiment in that the plate 120 that becomes the microlens substrate is mounted on a rotational stage rotating about the Y axis. The second collimator lens 37 is arranged so that the distance between the scattering plate 36 and the second collimator lens 37 is coincident with the focal length of the second collimator lens 37.

The lights that have been passed through the second collimator lens 37 are guided to the plate 120 that becomes the microlens substrate having the negative resist layer 22 formed thereon by coating. The negative resist layer 22 is formed on the focal surface of the first microlens array 4. An image of the linear light source is formed on the negative resist layer 22 by the second collimator lens 37 and the respective lenses on the first microlens array 4, and the negative resist layer 22 is linearly exposed right under the respective lenses.

On the other hand, the plate 120 that becomes the microlens substrate is mounted on the rotational stage rotating about the Y axis. By controlling a rotational angle of this rotational stage, a tilt angle θ formed between the normal of the plate 120 that becomes the microlens substrate and the optical axis of each ray can be freely changed. Besides, by rotating the rotational stage, the position of the image of the linear light source can be changed.

Figure 8:
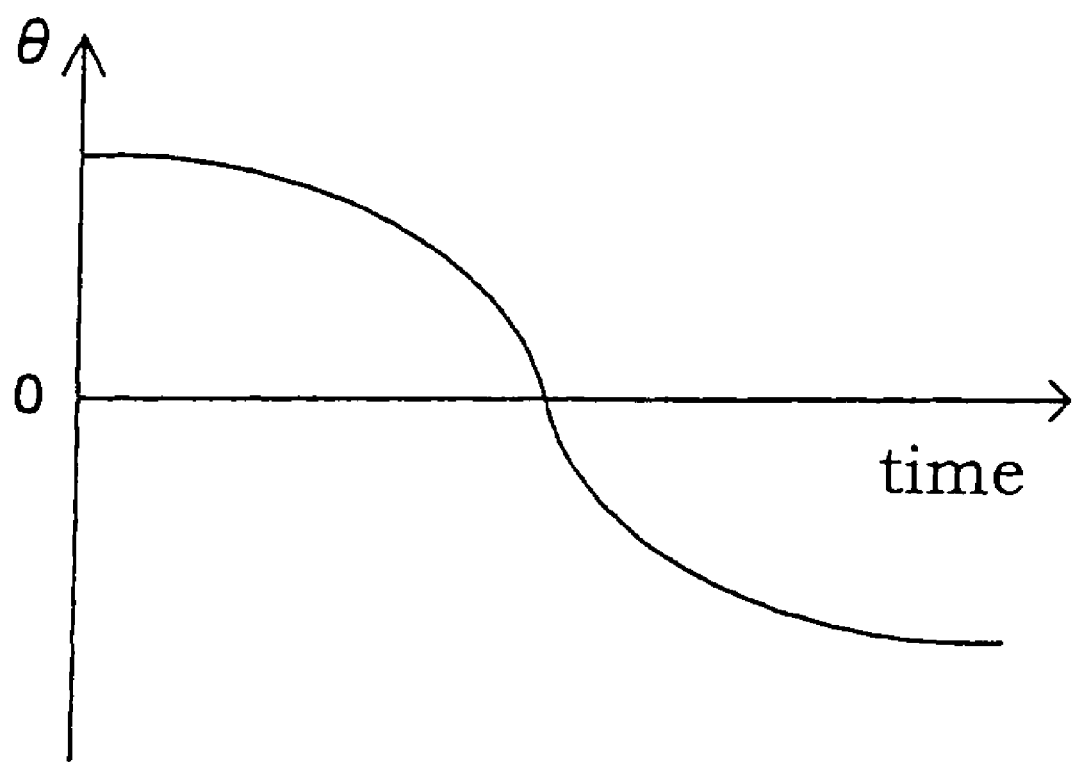
FIG. 8 illustrates control conditions for the second embodiment.

By controlling the rotational angle θ relative to time as shown in, for example, FIG. 8, the cylindrical resist structure as shown in FIG. 12B can be formed.

In this exposure optical system, it suffices to ensure abaxial characteristic of the second collimator lens 37 by as much as the length $L_Y$ of the linear light source. A ratio of a shorter side length to a longer side length of the outline of the cylindrical second microlens array is 1:3. Therefore, even when the abaxial characteristic of the second collimator lens 37 is required to be ±15° in, for example, the first embodiment, it suffices that the abaxial characteristic of ±5° is satisfied in the second embodiment, thereby relaxing requirements for the second collimator lens 37. Consequently, a less expensive collimator lens can be employed.

Third Embodiment

Figure 9:
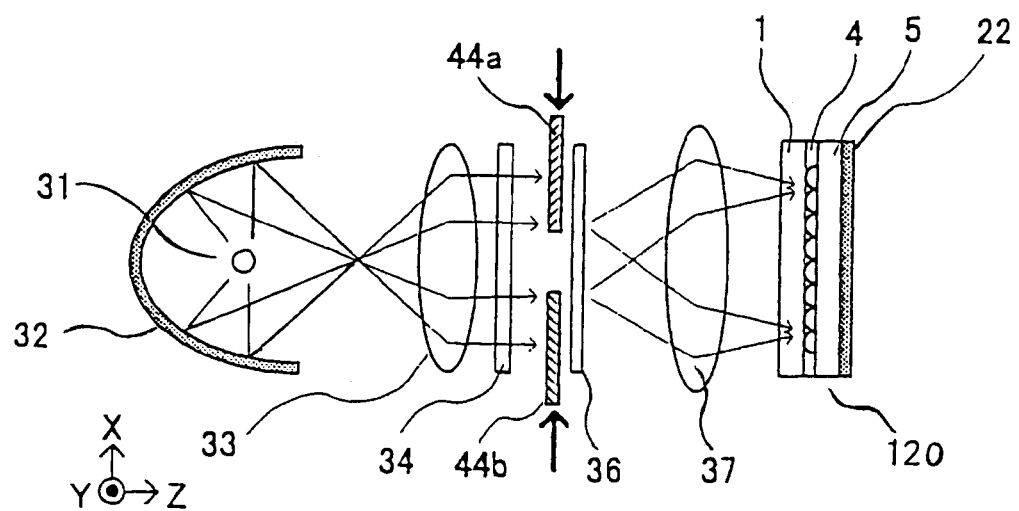
FIGS. 9A and 9B illustrate a third embodiment of the method of manufacturing, the microlens substrate according to the present invention.
Figure 9:
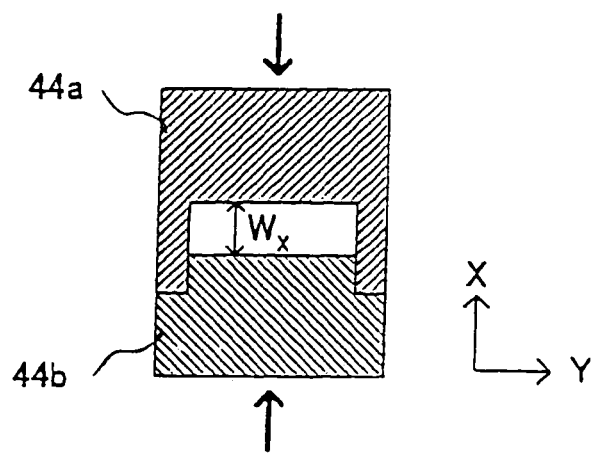

FIG. 9A illustrates a third embodiment of the configuration of an exposure optical system according to the present invention. In the third embodiment, the configuration from the light source 31 to the first collimator lens 33 is the same as that in the first embodiment.

The parallel light fluxes emitted from the first collimator lens 33 are passed through a slit plate 44 having a rectangular opening (slit) which is variable in its size and serving as an aperture and scattered by the scattering plate 36. That is, a rectangular surface light source is formed by the slit plate 44 and the scattering plate 36.

The slit plate 44 has a structure in which an opening width of this rectangular opening in the X direction can be changed, so that a size of the surface light source can be changed in the X-axis direction.

Namely, as shown in FIG. 9B, the slit plate 44 having a variable-size opening is constituted by a combination of shield plates 44a and 44b. Each of the shield plates 44a and 44b has a structure to be movable along the X axis. This movable structure enables changing an opening width $W_X$ of the rectangular opening in the X-axis direction.

Thereafter, lights of the surface light source are guided to the second collimator lens 37. The second collimator lens 37 is designed so that the distance between the scattering plate 36 and the second collimator lens 37 is coincident with the focal length of the second collimator lens 37.

The lights that have been passed through the second collimator lens 37 are guided to the plate 120 that becomes the microlens substrate having the negative resist layer 22 formed thereon by coating. The lights emitted from the rectangular surface light source are imaged on the focal surface of the first microlens array 4 via the second collimator lens 37 and the first microlens array 4. Since the resist layer 22 is formed on this focal surface, the resist layer 22 is exposed in a rectangular shape.

Figure 10:
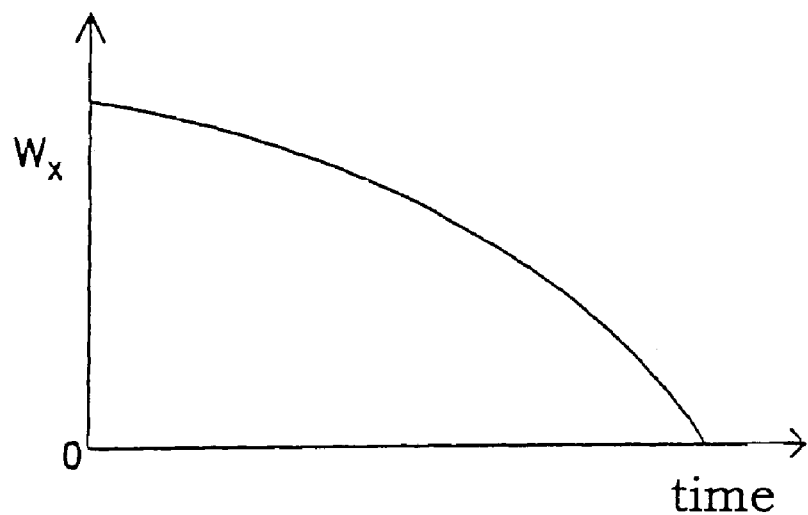
FIGS. 10A and 10B illustrate control conditions for the third embodiment.
Figure 10:
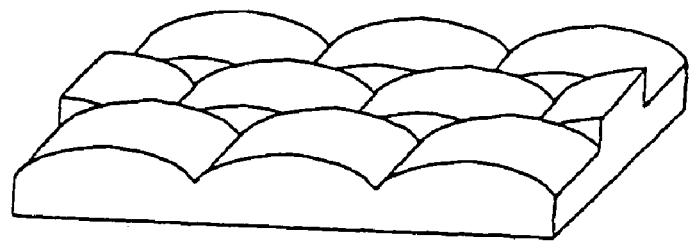
Figure 11:
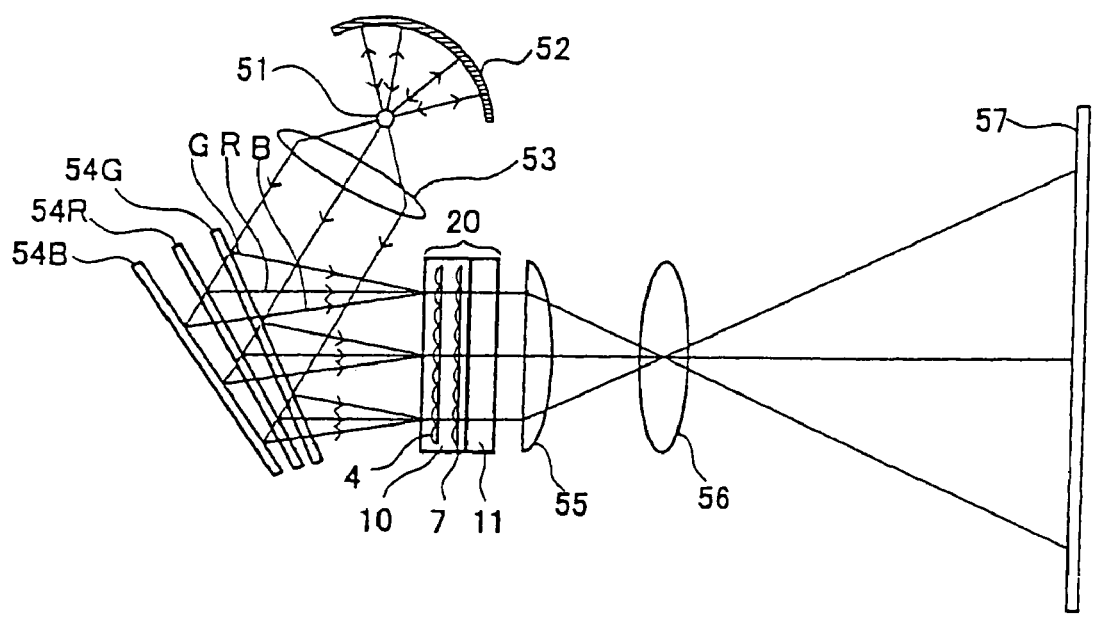
FIG. 11 illustrates the schematic configuration of a conventional projection-type liquid crystal display device that includes a microlens substrate and that employs a liquid crystal display element.

As shown in, for example, FIG. 10A, when exposure is performed while gradually decreasing the opening width $W_X$ of the rectangular opening of the slit plate 44, the size of the rectangular image on the resist layer 22 is gradually reduces, accordingly. Therefore, on the resist layer 22, an exposure amount in a central portion is large and that in an edge area is small. Namely, a cylindrical structure having a projected central portion can be formed as shown in FIG. 10B.

In the embodiments according to the present invention, the sensitizing of the negative resist layer 22 has been described. Alternatively, the three-dimensional structure may be formed using this exposure optical system for curing a visible light curable resin or UV curable resin.

What is claimed is:

1. A microlens exposure optical system used for manufacturing a microlens substrate having a first microlens array, an intermediate layer and a second microlens array laminated in this order on a transparent substrate, the microlens exposure optical system comprising:
    a linear light source emitting lights having a uniform intensity;
    a collimator lens collimating the lights emitted from the linear light source; and
    the transparent substrate having a photosensitive resin layer formed on the intermediate layer, the lights passed through the collimator lens being imaged on the photosensitive resin layer via the first microlens array and the intermediate layer.

2. The microlens exposure optical system according to claim 1, wherein
    a position of the linear light source is variable.

3. The microlens exposure optical system according to claim 1, wherein
    the transparent substrate is rotatably arranged so that a tilt angle formed between a normal of the transparent substrate and an optical axis of each light is variable.

4. The microlens exposure optical system according to any one of claims 1 to 3, further comprising:
    a narrow band-pass optical filter inserted into an optical path of the lights emitted from the linear light source.

* * * * *